(12) United States Patent
Adre et al.

(10) Patent No.: US 9,343,722 B2
(45) Date of Patent: May 17, 2016

(54) BATTERY PACK HAVING A SPRING TO CONNECT AT LEAST TWO BATTERY CELLS

(71) Applicant: INTEL CORPORATION, Santa Clara, CA (US)

(72) Inventors: Norman U. Adre, Beaverton, OR (US); Naoki Matsumura, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 167 days.

(21) Appl. No.: 14/142,587

(22) Filed: Dec. 27, 2013

(65) Prior Publication Data

US 2015/0188112 A1    Jul. 2, 2015

(51) Int. Cl.
| | |
|---|---|
| G06F 1/16 | (2006.01) |
| H01M 2/20 | (2006.01) |
| G06F 1/18 | (2006.01) |
| H01M 10/42 | (2006.01) |
| H05K 1/11 | (2006.01) |

(52) U.S. Cl.
CPC .............. *H01M 2/204* (2013.01); *G06F 1/188* (2013.01); *H01M 10/425* (2013.01); *H05K 1/11* (2013.01); *H01M 2010/4271* (2013.01); *H01M 2220/30* (2013.01)

(58) Field of Classification Search
USPC ............ 429/82, 72, 90, 99, 100, 123, 7, 158, 429/120, 164, 178, 149, 151; 361/679.55, 361/679.01, 679.41, 679.58, 679.44, 361/679.02, 679.22, 679.17, 679.21, 361/679.33, 679.59, 679.38, 679.39; 320/112, 127, 109, 103, 136, 115, 116, 320/107, 134, 106, 111, 128, 108; 29/426.5, 605, 593, 623.1, 730; 455/573, 575.1, 575.4, 121.3, 425, 455/351, 572, 343.1, 127.1; 345/1.3, 211, 345/173
See application file for complete search history.

(56) References Cited

U.S. PATENT DOCUMENTS

| | | |
|---|---|---|
| 6,929,879 B2 | 8/2005 | Yamazaki |
| 7,160,643 B2 | 1/2007 | Kunimoto et al. |
| 2009/0068555 A1 | 3/2009 | Fukuoka et al. |
| 2011/0311858 A1 | 12/2011 | Lim |
| 2012/0244399 A1* | 9/2012 | Tartaglia .................. 429/82 |
| 2013/0108902 A1* | 5/2013 | Kristofek et al. ............. 429/72 |

FOREIGN PATENT DOCUMENTS

| | | |
|---|---|---|
| JP | 2003-223876 A | 8/2003 |
| KR | 10-2008-0042960 A | 5/2008 |

OTHER PUBLICATIONS

International Search Report and Written Opinion for PCT/US2014/067610 dated Feb. 27, 2015.

* cited by examiner

*Primary Examiner* — Hung Duong
(74) *Attorney, Agent, or Firm* — KED & Associates LLP

(57) ABSTRACT

A battery pack is provided that may include a first battery cell, a second battery cell and a first spring. The first spring to couple to the first battery cell and to the second battery cell.

17 Claims, 10 Drawing Sheets

BATTERY PACK HAVING A SPRING TO CONNECT AT LEAST TWO BATTERY CELLS

BACKGROUND

1. Field

Embodiments may relate to a battery pack having a spring to connect to at least two battery cells.

2. Background

Rechargeable batteries may be used in many electronic devices, including laptop and notebook computers and similar mobile computing devices. The batteries may include lithium ion (Li-ion) and other battery technologies.

BRIEF DESCRIPTION OF THE DRAWINGS

Arrangements and embodiments may be described in detail with reference to the following drawings in which like reference numerals refer to like elements and wherein.

DETAILED DESCRIPTION

In the following detailed description, like numerals and characters may be used to designate identical, corresponding and/or similar components in differing figure drawings. Further, in the detailed description to follow, example sizes/models/values/ranges may be given although embodiments are not limited to the same. Where specific details are set forth in order to describe example embodiments, it should be apparent to one skilled in the art that embodiments may be practiced without these specific details.

An electronic device may be any one of a smart watch, a mobile terminal, a mobile device, a mobile computing device, a mobile computing platform, a mobile platform, a laptop computer, a tablet, an ultra-mobile personal computer, a mobile Internet device, a smartphone, a personal digital assistant, a display device, a television (TV), etc. The electronic device may include a rechargeable battery power source. For ease of discussion, the following description may relate to a smart watch.

A battery may be a device that generates electrical potential through a chemical reaction. A battery may include a rechargeable battery that may be restored to operation by a charging operation. Batteries may include, but are not limited to, nickel cadmium (NiCad), lithium ion (Li-ion), and other rechargeable batteries.

A battery pack may be a package of one or more battery cells (or battery cell structures). Battery packs may be used in operation of many electronic devices, including electronic devices, mobile computing devices and/or smart watches. The battery cells may be in the form of cell blocks, where each cell block may contain one or more battery cells.

A battery control unit may be a unit to control certain operations of a battery. A battery pack may include a battery control unit. A battery control unit may be referred to as a battery management unit. A battery management unit may include a unit to measure a voltage for each cell block of a battery pack, for example.

A battery pack may include one or more battery cell blocks, with each cell block containing one or more battery cells (or battery cell structures). A battery pack may further include or be coupled with a battery control unit to control certain battery management operations. A battery control unit may be referred to as a battery management unit (BMU). A system may utilize the battery management unit to monitor voltages of each cell block of a battery pack for purposes of detecting short circuits that may be developing in one or more battery cells.

A lithium ion battery may not be flexible or bendable. For example, if a lithium ion battery is flexed or bent, then the lithium ion battery may short circuit and may cause damage to the battery, which in turn may cause a fire (or spark) since lithium is combustible when exposed to moisture.

Figure 1:
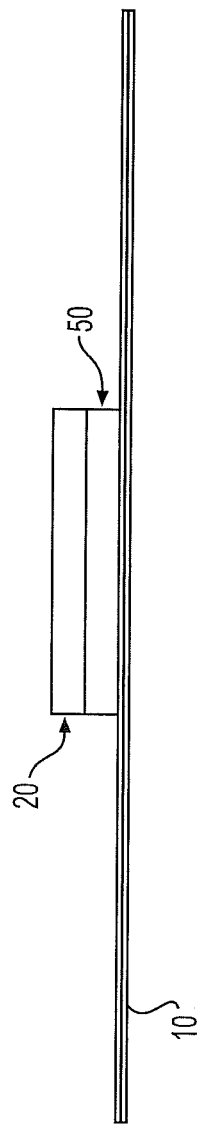
FIG. 1 is a side view of a smart watch according to an example embodiment.

FIG. 1 is a side view of a smart watch according to an example arrangement. Other arrangements may also be provided.

In the arrangement of FIG. 1, a smart watch may include a band 10, a system board 20 (or circuit board) and a battery 50. The battery 50 may be a battery pack. The battery pack may include a plurality of battery cells (or battery cell structures).

The system board 20 may be a circuit board (or printed circuit board) that is provided for different components. For example, the system board 20 may be electrically connected to the battery 50 such that components on or at the system board 20 may be powered. As one example, a display, a processor, a controller and/or a memory may be coupled to, the system board 20. Additionally, a camera and/or a sensor (or a plurality of sensors) may be coupled to the system board 20.

The band 10 may be stretchable when provided on a user (or other item). In this arrangement, the battery 50 may be provided directly on a specific area of the band 10. The system board 20 may then be provided on the battery 50 such that the battery 50 is between the system board 20 and the band 10.

Figure 2:
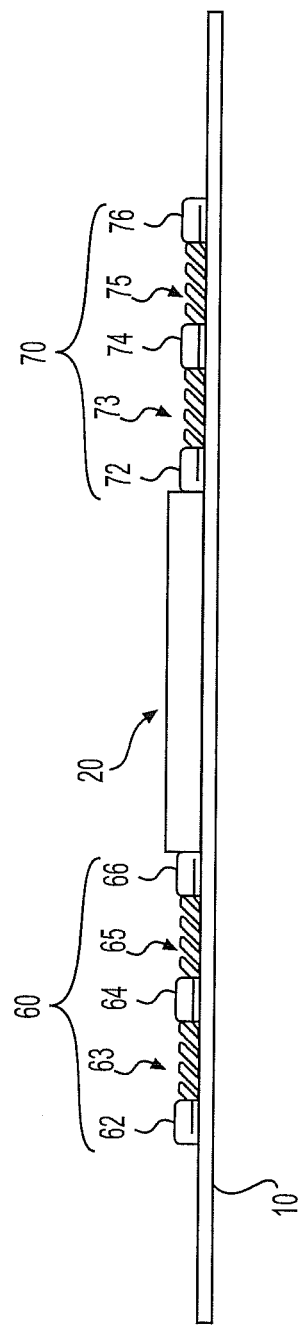
FIG. 2 is a side view of a smart watch according to an example embodiment.

FIG. 2 is a side view of a smart watch according to an example embodiment. Other embodiments and configurations may also be provided.

FIG. 2 shows a smart watch (or other electronic device) in which a battery pack is provided at a different area of the band 10. FIG. 2 shows a first battery pack 60 on a first side of the system board 20 and a second battery pack 70 on a second side of the system board 20.

In at least one embodiment, a battery pack may be provided on one side of the system board 20. In at least one embodiment, a battery pack may be provided on each side of the system board 20.

FIG. 2 shows that the first battery pack 60 may include a plurality of battery cells (or battery cell structures). For ease of illustration, the first battery pack 60 (in FIG. 2) only shows three battery cells, namely battery cells 62, 64 and 66. Other numbers of battery cells may also be provided.

FIG. 2 that shows the second battery pack 70 may include a plurality of battery cells (or battery cell structures). For ease of illustration, the battery pack 70 (in FIG. 2) only shows three battery cells, namely battery cells 72, 74 and 76. Other numbers of battery cells may also be provided.

FIG. 2 also shows that a separate spring (or spring device) may be provided between each pair of battery cells (i.e., between adjacent battery cells). In at least one embodiment, the spring may be coupled to an electrode of a first battery cell and to an electrode of a second battery cell. In at least one embodiment, the electrode may be provided at one end of the battery cell. In at least one embodiment, the electrode may be provided at a side area (or central area) of the battery cell.

The spring may be an attaching device to attach to two separate devices, such as separate electrodes of separate battery cells. The spring may be capable of expanding, and thereby increasing a distance between two battery cells. The spring may also be capable of compressing, and thereby decreasing a distance between two battery cells. The spring can expand, compress, flex, bend, etc. The spring may be made of an electrically conductive material.

FIG. 2 shows that a spring 63 (or spring portion) is coupled between the battery cell 62 and the battery cell 64, and a spring 65 (or spring portion) is coupled between the battery cell 64 and the battery 66. The battery cell 66 may be coupled to the system board 20. In at least one embodiment, the battery cell 66 may be coupled to the system board 20 by a spring.

FIG. 2 shows that the battery cell 72 may be coupled to the system board 20. FIG. 2 shows that a spring 73 (or spring portion) is coupled between the battery cell 72 and the battery cell 74, and a spring 75 (or spring portion) is coupled between the battery cell 74 and the battery cell 76. In at least one embodiment, the battery cell 76 may be coupled to the system board 20 by a spring.

In one example, the battery cell 66 may be coupled to the system board 20 via a connector with a cable or with a cable with spot welding, soldering, etc. In another example, the battery cell 66 may be connected to a battery protection circuit (or battery protection circuit module), and the battery protection circuit may be connected to the system board 20 via a connector with a cable or with a cable with sport welding, soldering, etc.

The battery cell 72 may be coupled to the system board 20 in a similar manner as the battery cell 66.

Figure 3:
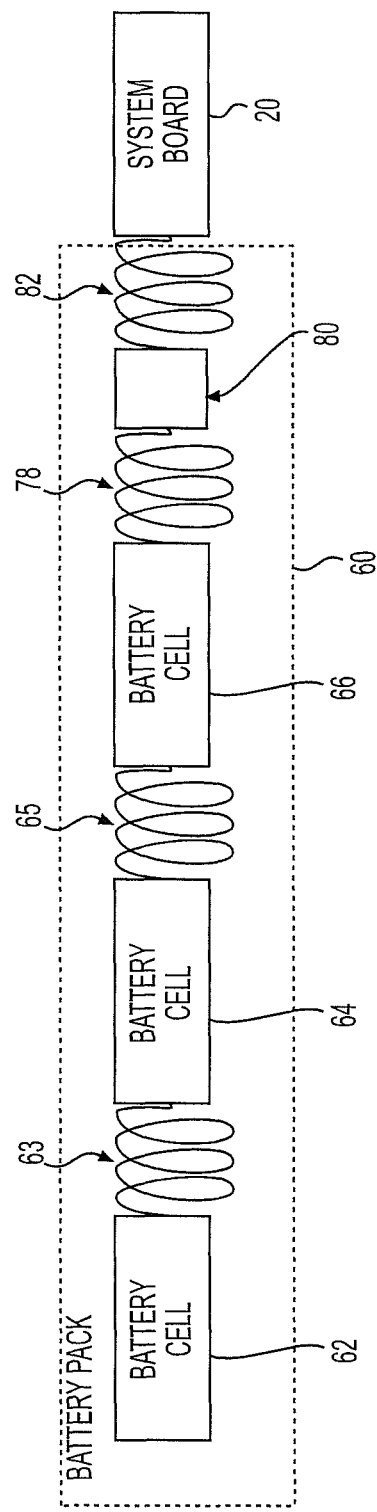
FIG. 3 is a side view of a battery pack and a system board according to an example embodiment.

FIG. 3 is a side view of a battery pack and a system board according to an example embodiment. Other embodiments and configurations may also be provided.

FIG. 3 shows the battery pack 60 includes the battery cell 62, the battery cell 64 and the battery cell 66. The spring 63 is coupled to the battery cell 62 and to the battery cell 64, and the spring 65 is coupled to the battery cell 64 and to the battery cell 66.

FIG. 3 also shows a battery protection circuit 80 (or battery protection module) provided within the battery pack 60 (or other battery packs). The battery protection circuit 80 may include circuitry to prevent overcharge, over discharge, over temperature, etc. The battery protection circuit 80 may be coupled to the battery cell 66 and to the system board 20. A spring 78 may be coupled to the battery cell 66 and to the battery protection circuit 80, and a spring 82 may be coupled to the battery protection circuit 80 and to the system board 20.

Figure 4:
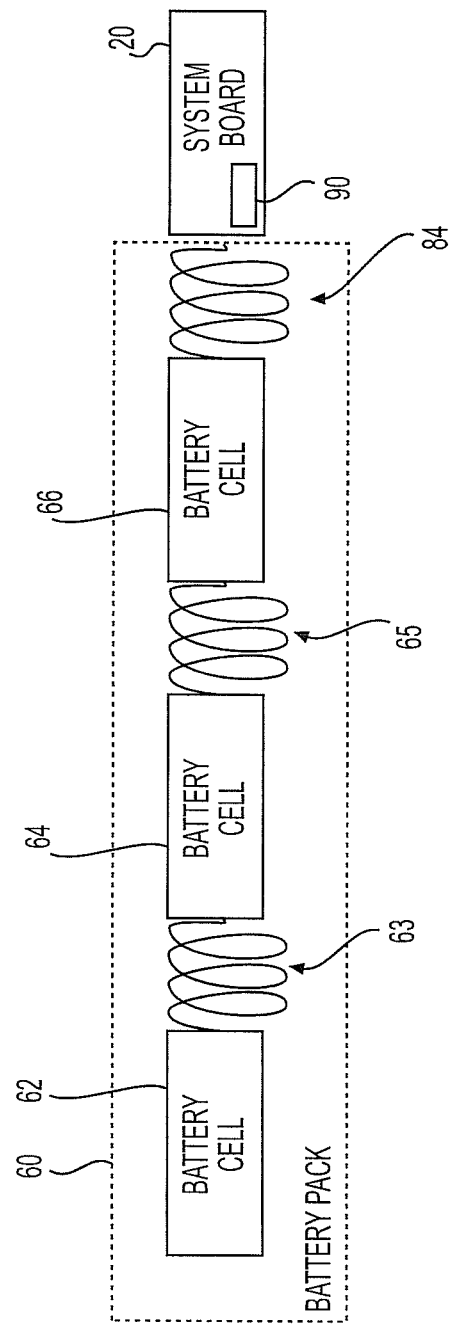
FIG. 4 is a side view of a battery pack and a system board according to an example embodiment.

FIG. 4 is a side view of a battery pack and a system board according to an example embodiment. Other embodiments and configurations may also be provided.

FIG. 4 shows the battery pack 60 includes the battery cell 62, the battery cell 64 and the battery cell 66. The spring 63 is coupled to the battery cell 62 and to the battery cell 64, and the spring 65 is coupled to the battery cell 64 and to the battery cell 66.

FIG. 4 also shows a spring 84 coupled to the battery cell 66 and to the system board 20.

In FIG. 4, the system board 20 may include a battery protection circuit 90 (or battery protection module). The battery protection circuit 90 is outside the battery pack 60 (or other battery packs). The battery protection circuit 90 may include circuitry to prevent overcharge, over discharge, over temperature, etc.

Figure 5:
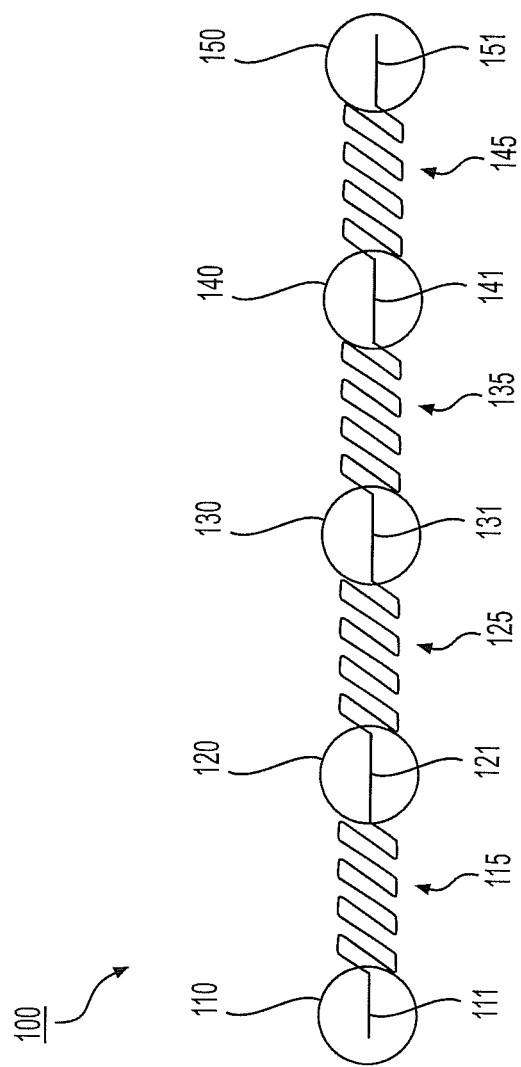
FIG. 5 is a side view of a battery pack having cylindrical battery cells according to an example embodiment.

FIG. 5 is a side view of a battery pack having cylindrical battery cells according to an example embodiment. Other embodiments and configurations may also be provided. The battery pack shown in FIG. 5 may correspond to one of the first battery pack 60 and the second battery pack 70.

FIG. 5 shows a battery pack 100 having a plurality of battery cells, namely battery cells 110, 120, 130, 140 and 150. In FIG. 5, each of the battery cells 110, 120, 130, 140 and 150 may be a cylindrical battery cell. Other types or shapes of battery cells may also be provided. The battery pack 100 may include a battery protection circuit, as discussed above. The battery pack may include a battery protection circuit.

FIG. 5 shows that an electrode 111 is provided at one end of the battery cell 110, an electrode 121 is provided at one end of the battery cell 120, and an electrode 131 is provided at one end of the battery cell 130. FIG. 5 also shows an electrode 141 is provided at one end of the battery cell 140 and an electrode 151 is provided at one end of the battery cell 150.

FIG. 5 also shows that a spring 115 is coupled to the battery cell 110 and to the battery cell 120, and a spring 125 is coupled to the battery cell 120 and to the battery cell 130. FIG. 5 further shows that a spring 135 is coupled to the battery cell 130 and to the battery cell 140, and a spring 145 is coupled to the battery cell 140 and to the battery cell 150. In at least one embodiment, a combination of each of the springs 115, 125, 135 and 145 may be considered a single spring (or attachment mechanism).

The springs 115, 125, 135 and 145 may each be directly connected to an electrode of the respective one of the battery cells.

Figure 6:
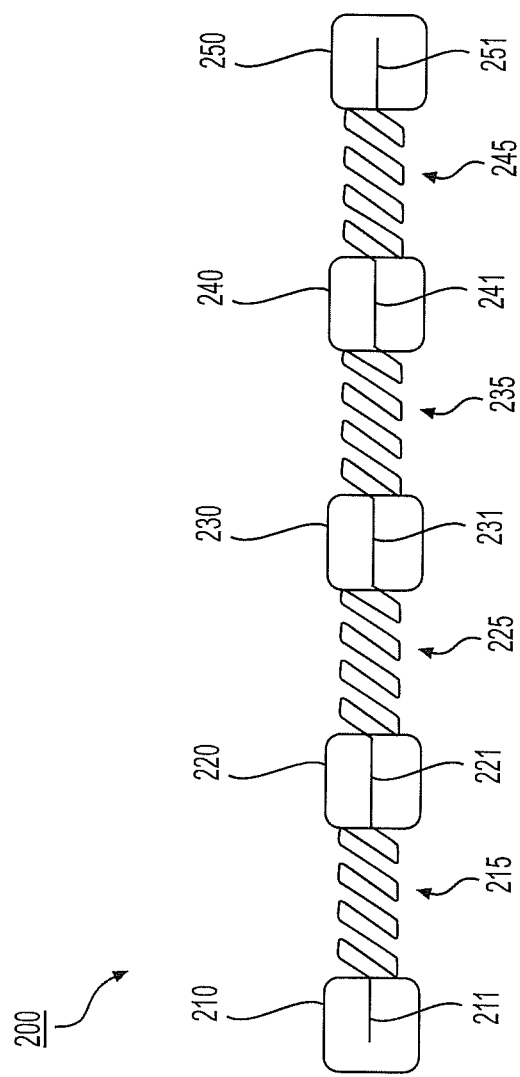
FIG. 6 is a side view of a battery pack having rectangular battery cells according to an example embodiment.

FIG. 6 is a side view of a battery pack having rectangular cells according to an example embodiment. Other embodiments and configurations may also be provided. The battery pack may include a battery protection circuit.

More specifically, FIG. 6 shows a battery pack 200 having a plurality of battery cells, namely battery cells 210, 220, 230, 240 and 250. In FIG. 6, each of the battery cells 210, 220, 230, 240 and 250 may be a rectangular battery cell. Other types or shapes of battery cells may also be provided. The battery pack 200 may correspond to one of the battery packs discussed above.

FIG. 6 shows that an electrode 211 is provided at one end of the battery cell 210, an electrode 221 is provided at one end of the battery cell 220, and an electrode 231 is provided at one end of the battery cell 230. FIG. 6 also shows an electrode 241 is provided at one end of the battery cell 240 and an electrode 251 is provided at one end of the battery cell 250.

FIG. 6 also shows that a spring 215 is coupled to the battery cell 210 and to the battery cell 220, and a spring 225 is coupled to the battery cell 220 and to the battery cell 230. FIG. 6 further shows that a spring 235 is coupled to the battery cell 230 and to the battery cell 240, and a spring 245 is coupled to the battery cell 240 and to the battery cell 250. In at least one embodiment, a combination of each of the springs 215, 225, 235 and 245 may be considered a single spring (or attachment mechanism).

The springs 215, 225, 235 and 245 may each be directly connected to an electrode of the respective one of the battery cells.

Figure 7:
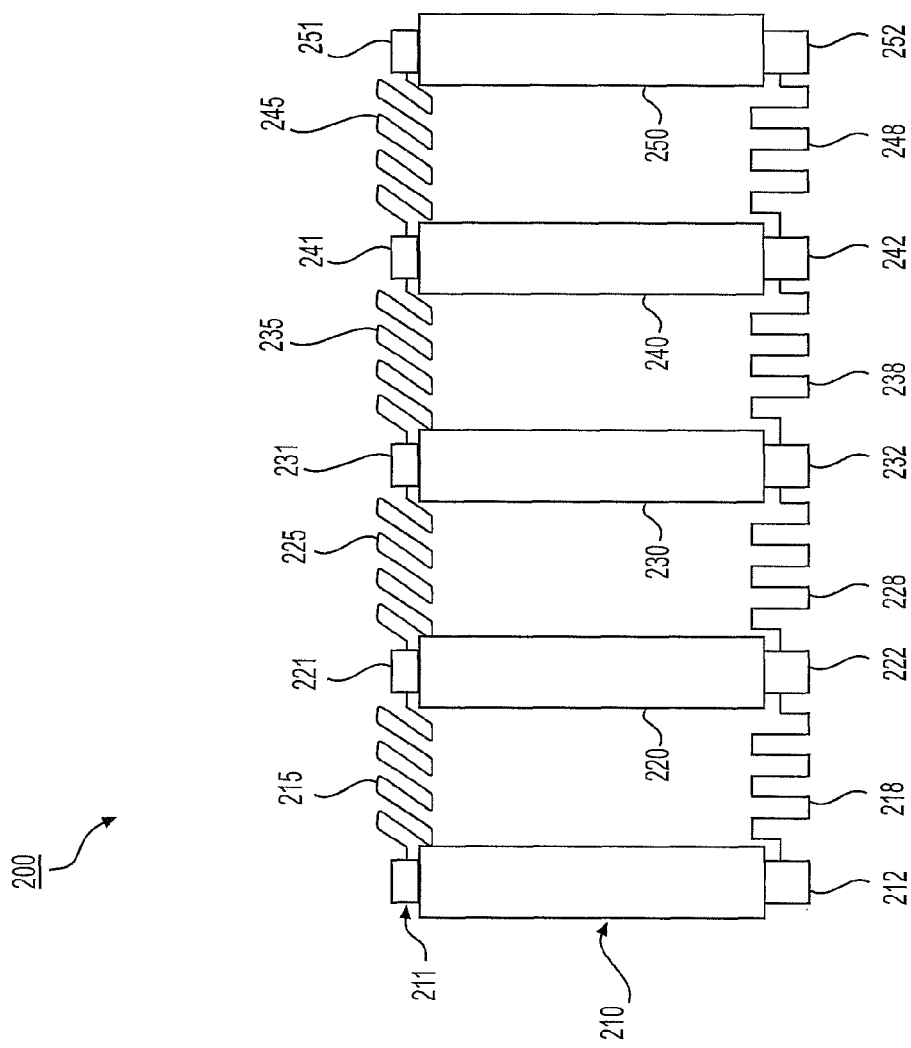
FIG. 7 is a top view of a battery pack according to an example embodiment.

FIG. 7 is a top view of a battery pack according to an example embodiment. Other embodiments and configurations may also be provided. FIG. 75 is a top view of the battery pack 200 shown in FIG. 6. The battery pack may include a battery protection circuit.

FIG. 7 shows that the battery cell 210 includes the first electrode 211 and a second electrode 212, the battery cell 220 includes the first electrode 221 and a second electrode 222, and the battery cell 230 includes the first electrode 231 and a second electrode 233. FIG. 7 also shows that the battery cell 240 includes the first electrode 241 and a second electrode 242, and the battery cell 250 includes the first electrode 251 and a second electrode 252.

FIG. 7 shows that the spring 215 is coupled to the first electrode 211 (of the first battery cell 210) and to the first electrode 221 (of the second battery cell 220). FIG. 7 also shows that the spring 225 is coupled to the first electrode 221 (of the first battery cell 220) and to the first electrode 231 (of the second battery cell 230).

FIG. 7 shows that the spring 235 is coupled to the first electrode 231 (of the third battery cell 230) and to the first electrode 241 (of the fourth battery cell 240). FIG. 7 also shows that the spring 245 is coupled to the first electrode 241 (of the fourth battery cell 240) and to the first electrode 251 (of the fifth battery cell 250).

FIG. 7 shows that a spring 218 (or spring portion) is coupled to the second electrode 212 (of the first battery cell 210) and to the second electrode 222 (of the second battery cell 220). FIG. 7 also shows that a spring 228 (or spring portion) is coupled to the second electrode 222 (of the second battery cell 220) and to the second electrode 232 (of the third battery cell 230).

FIG. 7 shows that a spring 238 (or spring portion) is coupled to the second electrode 232 (of the third battery cell 230) and to the second electrode 242 (of the fourth battery cell 240). FIG. 7 also shows that a spring 248 (or spring portion) is coupled to the second electrode 242 (of the fourth battery cell 240) and to the second electrode 252 (of the fifth battery cell 250).

Embodiments may include springs coupled to (or between) different battery cells of a battery pack. Embodiments may also include a single spring coupled to (or between) different battery cells.

Each spring (or spring portion) may be separately compressed into a smaller structure (or state), and thereby providing a smaller gap (or decreased gap) between adjacent corresponding battery cells.

Each spring (or spring portion) may be separately expanded into a larger structure (or state), and thereby providing a larger gap (or increased gap) between adjacent corresponding battery cells.

Figure 8:
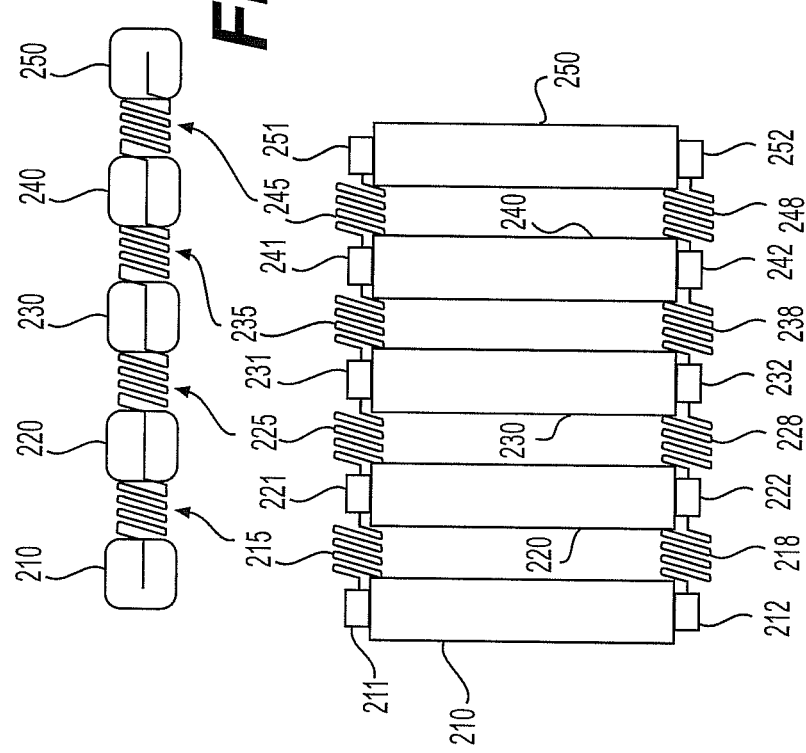
FIGS. 8A-8B are views of a battery pack in a compressed state according to an example embodiment.

FIG. 8A is a side view of a battery pack in a compressed state according to an example embodiment. FIG. 8B is a top view of a battery pack in a compressed state according to an example embodiment. Other embodiments and configurations may also be provided.

The battery pack shown in each of FIG. 8A and FIG. 8B may correspond the battery pack 200 discussed above with respect to FIG. 6 and FIG. 7, respectively.

As may be seen in FIGS. 8A and 8B, the spring 215 may be in a compressed structure (or state) between the first electrode 211 (of the first battery cell 210) and the first electrode 221 (of the second battery cell 220), or coupled to each of the electrodes. FIGS. 8A and 8B also show the spring 225 in a compressed structure (or state) between the first electrode 221 (of the second battery cell 220) and the first electrode 231 (of the third battery cell 230), or coupled to each of the electrodes.

FIGS. 8A and 8B show the spring 235 in a compressed structure (or state) between the first electrode 231 (of the third battery cell 230) and the first electrode 241 (of the fourth battery cell 240), or coupled to each of the electrodes. FIGS. 8A and 8B also show the spring 245 in a compressed structure (or state) between the first electrode 241 (of the fourth battery cell 240) and the first electrode 251 (of the fifth battery cell 250), or coupled to each of the electrodes.

FIGS. 8A and 8B show the spring 218 in a compressed state between the second electrode 212 (of the first battery cell 210) and the second electrode 222 (of the second battery cell 220), or coupled to each of the electrodes. FIGS. 8A and 8B also show the spring 228 in a compressed structure (or state) between the second electrode 222 (of the second battery cell 220) and the second electrode 232 (of the third battery cell 230), or coupled to each of the electrodes.

FIGS. 8A and 8B show the spring 238 in a compressed structure (or state) between the second electrode 232 (of the third battery cell 230) and the second electrode 242 (of the fourth battery cell 240), or coupled to each of the electrodes. FIGS. 8A and 8B also show the spring 248 in a compressed structure (or state) between the second electrode 242 (of the fourth battery cell 240) and the second electrode 252 (of the fifth battery cell 250), or coupled to each of the electrodes.

Figure 9:
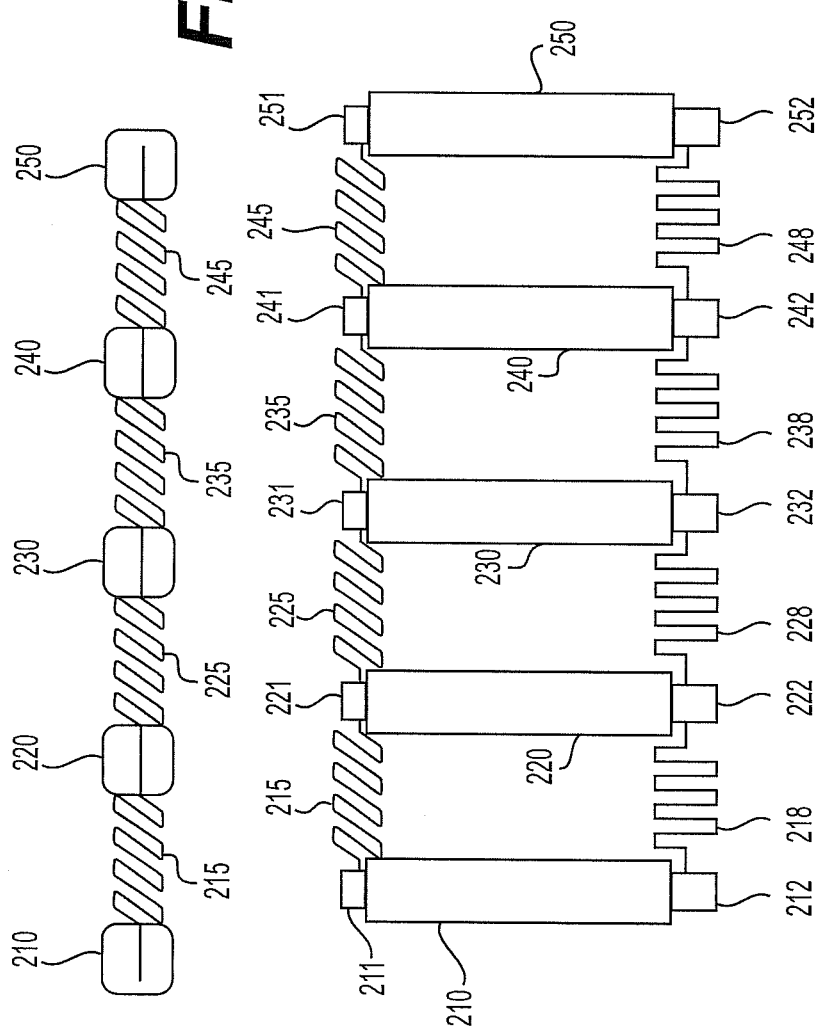
FIGS. 9A-9B are views of a battery pack in a stretched state according to an example embodiment.

FIG. 9A is a side view of a battery pack in a stretched state according to an example embodiment. FIG. 9B is a top view of a battery pack in a stretched state according to an example embodiment. Other embodiments and configurations may also be provided. The stretched state may also be called an expanded state.

The battery pack shown in each of FIG. 9A and FIG. 9B may correspond to the battery pack 200 discussed above with respect to FIG. 6 and FIG. 7, respectively.

As may be seen in FIGS. 9A and 9B, the spring 215 may be in a stretched structure (or state) between the first electrode 211 (of the first battery cell 210) and the first electrode 221 (of the second battery cell 220), or coupled to each of the electrodes. FIGS. 9A and 9B also show the spring 225 in a stretched structure (or state) between the first electrode 221 (of the second battery cell 220) and the first electrode 231 (of the second battery cell 230), or coupled to each of the electrodes.

FIGS. 9A and 9B show the spring 235 in a stretched structure (or state) between the first electrode 231 (of the third battery cell 230) and the first electrode 241 (of the fourth battery cell 240), or coupled to each of the electrodes. FIGS. 9A and 9B also show the spring 245 in a stretched structure (or state) between the first electrode 241 (of the fourth battery cell 240) and the first electrode 251 (of the fifth battery cell 250), or coupled to each of the electrodes.

FIGS. 9A and 9B show the spring 218 in a stretched structure (or state) between the second electrode 212 (of the first battery cell 210) and the second electrode 222 (of the second battery cell 220), or coupled to each of the electrodes. FIGS. 9A and 9B also show the spring 228 in a stretched structure (or state) between the second electrode 222 (of the second battery cell 220) and the second electrode 232 (of the third battery cell 230), or coupled to each of the electrodes.

FIGS. 9A and 9B show the spring 238 is in a stretched structure (or state) between the second electrode 232 (of the third battery cell 230) and the second electrode 242 (of the fourth battery cell 240), or coupled to each of the electrodes. FIGS. 9A and 9B also show the spring 248 in a stretched structure (or state) between the second electrode 242 (of the fourth battery cell 240) and the second electrode 252 (of the fifth battery cell 250), or coupled to each of the electrodes.

Figure 10:
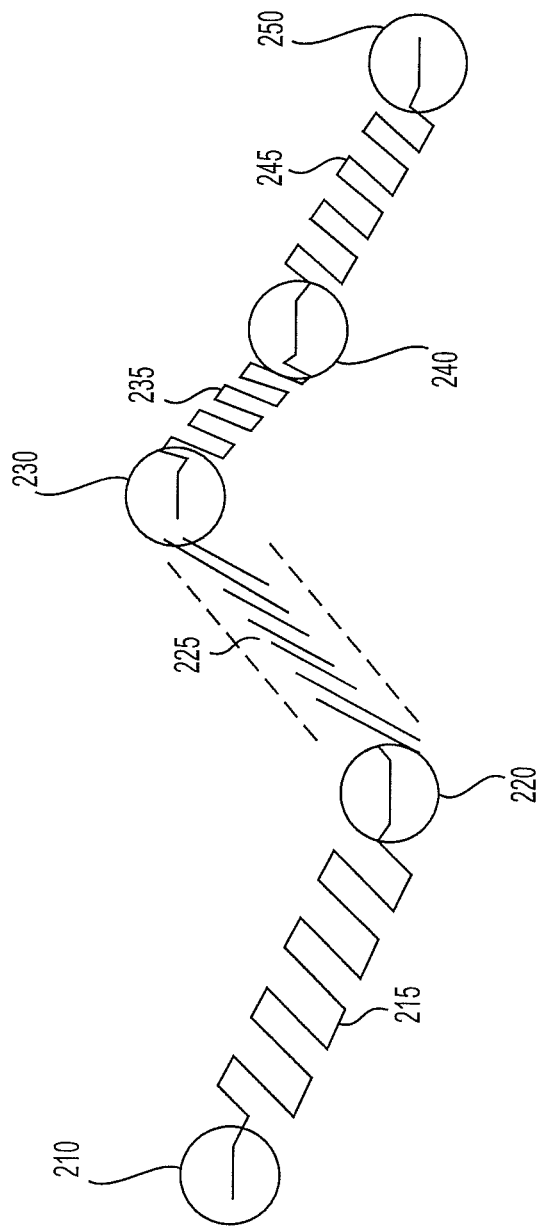
FIG. 10 is a side view of a battery pack in a bendable state (or structure) according to an example embodiment.

FIG. 10 is a side view of a battery pack in a bendable structure (or state) according to an example embodiment. Other embodiments and configurations may also be provided.

As may be seen in FIG. 10, the spring 215 may be in a stretched structure (or state) between the first electrode 211 (of the first battery cell 210) and the first electrode 221 (of the second battery cell 220), or coupled to each of the electrodes. FIG. 10 also shows the spring 225 bent in a different direction between the first electrode 221 (of the first battery cell 220) and the first electrode 231 (of the second battery cell 230), or coupled to each of the electrodes. Stated differently, the spring 215 is along a first direction and the spring 225 is along a second direction.

FIG. 10 also shows the spring 235 in a compressed structure (or state) and being bent in a different direction between the first electrode 231 (of the third battery cell 230) and the first electrode 241 (of the fourth battery cell 240), or coupled to each of the electrodes. FIG. 10 also shows the spring 245 bent in a different direction between the first electrode 241 (of the fourth battery cell 240) and the first electrode 251 (of the fifth battery cell 250), or coupled to each of the electrodes.

The following examples pertain to further embodiments.

Example 1 is a battery pack comprising: a first battery cell having a first electrode, a second battery cell having a second electrode, and a first spring coupled to the first battery cell and to the second battery cell.

In Example 2, the subject matter of Example 1 can optionally include that the first spring to expand and to increase a distance between the first battery cell and the second battery cell.

In Example 3, the subject matter of Example 1 can optionally include that the first spring to compress and to decrease a distance between the first battery cell and the second battery cell.

In Example 4, the subject matter of Example 1 can optionally include that the first spring is coupled to the first electrode of the first battery cell, and the first spring is coupled to the second electrode of the second battery cell.

In Example 5, the subject matter of Example 1 can optionally include that the first electrode of the first battery cell is at an end portion of the first battery cell.

In Example 6, the subject matter of Example 1 can optionally include that the first electrode of the first battery cell is at a side of the first battery cell.

In Example 7, the subject matter of Example 1 can optionally include a battery protection circuit and a second spring, the second spring coupled to the battery protection circuit.

In Example 8, the subject matter of Example 1 can optionally include a third battery cell having a third electrode, and a second spring coupled to the second battery cell and to the third battery cell.

In Example 9, the subject matter of Example 1 and Example 8 can optionally include that the second spring is coupled to the second electrode of the second battery cell, and the second spring is coupled to the third electrode of the third battery cell.

In Example 10, the subject matter of Example 1 and Example 9 can optionally include a third spring coupled to the first battery cell and the second battery cell, and a fourth spring coupled to the second battery cell and to the third battery cell.

In Example 11, the subject matter of Example 1 and Example 10 can optionally include that the third spring is coupled to a fourth electrode of the first battery cell and is coupled to a fifth electrode of the second battery cell, and the fourth spring is coupled to the fifth electrode of the second battery cell and is coupled to a sixth electrode of the third battery cell.

In Example 12, the subject matter of Example 1 and Example 8 can optionally include that the first spring is coupled to the first electrode of the first battery cell and to a fourth electrode of the second battery cell, and the second spring is coupled to the second electrode of the second battery cell and the third electrode of the second battery cell.

In Example 13, the subject matter of Example 1 and Example 12 can optionally include that the first electrode and the fourth electrode are of opposite polarities, and the second electrode and the third electrode are of opposite polarities.

In Example 14, the subject matter of Example 1 and Example 8 can optionally include that the first battery cell, the second battery cell and the third battery cell are coupled in series.

Example 15 is an electronic device comprising: a circuit board to have at least one electronic component, a first battery cell having a first electrode, a second battery cell having a second electrode, and a first spring coupled to the first battery cell and to the second battery cell.

In Example 16, the subject matter of Example 15 can optionally include that the first spring to expand and to increase a distance between the first battery cell and the second battery cell.

In Example 17, the subject matter of Example 15 can optionally include that the first spring to compress and to decrease a distance between the first battery cell and the second battery cell.

In Example 18, the subject matter of Example 15 can optionally include that the second battery cell to couple to the circuit board.

In Example 19, the subject matter of Example 15 can optionally include a battery protection circuit.

In Example 20, the subject matter of Example 15 and Example 19 can optionally include a second spring coupled to the second battery cell, and the second spring to couple to the battery protection circuit.

In Example 21, the subject matter of Example 15 and Example 20 can optionally include a third spring coupled to the battery protection circuit and to couple to the circuit board.

In Example 22, the subject matter of Example 15 and Example 19 can optionally include that the battery protection circuit is at the circuit board.

In Example 23, the subject matter of Example 15 can optionally include that the first spring is coupled to the first electrode of the first battery cell, and the first spring is coupled to the second electrode of the second battery cell.

In Example 24, the subject matter of Example 15 can optionally include that the first electrode of the first battery cell is at an end portion of the first battery cell.

In Example 25, the subject matter of Example 15 can optionally include that the first electrode of the first battery cell is at a side of the first battery cell.

In Example 26, the subject matter of Example 15 can optionally include a third battery cell having a third electrode, and a second spring coupled to the second battery cell and to the third battery cell.

In Example 27, the subject matter of Example 15 and Example 26 can optionally include that the second spring is coupled to the second electrode of the second battery cell, and the second spring is coupled to the third electrode of the third battery cell.

In Example 28, the subject matter of Example 15 and Example 27 can optionally include a third spring coupled to the first battery cell and to the second battery cell, and a fourth spring coupled to the second battery cell and to the third battery cell.

In Example 29, the subject matter of Example 15 and Example 28 can optionally include that the third spring is coupled to a fourth electrode of the first battery cell and is coupled to a fifth electrode of the second battery cell, and the fourth spring is coupled to the fifth electrode of the second battery cell and is coupled to a sixth electrode of the third battery cell.

In Example 30, the subject matter of Example 15 and Example 26 can optionally include that the first spring is coupled to the first electrode of the first battery cell and to a fourth electrode of the second battery cell, and the second spring is coupled to the second electrode of the second battery cell and the third electrode of the second battery cell.

In Example 31, the subject matter of Example 15 and Example 30 can optionally include that the first electrode and the fourth electrode are of opposite polarities, and the second electrode and the third electrode are of opposite polarities.

In Example 32, the subject matter of Example 15 and Example 26 can optionally include that the first battery cell, the second battery cell and the third battery cell are coupled in series.

In Example 33, the subject matter of Example 15 can optionally include that the electronic device is a smart watch.

In Example 34, the subject matter of Example 15 can optionally include a display to couple to the circuit board.

Example 35 is a battery pack comprising: a first battery cell having a first electrode, a second battery cell having a second electrode, and first means for coupling to the first battery cell and to the second battery cell and for changing a distance between the first battery cell and the second battery cell.

In Example 36, the subject matter of Example 35 can optionally include that the first means for coupling to expand and to increase a distance between the first battery cell and the second battery cell.

In Example 37, the subject matter of Example 35 can optionally include that the first means for coupling to compress and to decrease a distance between the first battery cell and the second battery cell.

In Example 38, the subject matter of Example 35 can optionally include that the first means for coupling being coupled to the first electrode of the first battery cell, and the first means for coupling being coupled to the second electrode of the second battery cell.

In Example 39, the subject matter of Example 35 can optionally include that the first electrode of the first battery cell is at an end portion of the first battery cell.

In Example 40, the subject matter of Example 35 can optionally include that the first electrode of the first battery cell is at a side of the first battery cell.

In Example 41, the subject matter of Example 35 can optionally include a battery protection circuit and a second spring, the second spring to couple to the battery protection circuit.

In Example 42, the subject matter of Example 35 can optionally include: a third battery cell having a third electrode, and second means for coupling to the second battery cell and to the third battery cell and for changing a distance between the second battery cell and the third battery cell.

In Example 43, the subject matter of Example 35 and Example 42 can optionally include that the second means for coupling being coupled to the second electrode of the second battery cell, and the second means for coupling being coupled to the third electrode of the third battery cell.

In Example 44, the subject matter of Example 35 and Example 43 can optionally include: third means for coupling to the first battery cell and the second battery cell, and fourth means for coupling to the second battery cell and to the third battery cell.

In Example 45, the subject matter of Example 35 and Example 44 can optionally include that the third means for coupling being coupled to a fourth electrode of the first battery cell and being coupled to a fifth electrode of the second battery cell, and the fourth means for coupling being coupled to the fifth electrode of the second battery cell and being coupled to the sixth electrode of the third battery cell.

In Example 46, the subject matter of Example 35 and Example 42 can optionally include that the first means for coupling being coupled to the first electrode of the first battery cell and to a fourth electrode of the second battery cell, and the second means for coupling being coupled to the second electrode of the second battery cell and the third electrode of the second battery cell.

In Example 47, the subject matter of Example 35 and Example 46 can optionally include that the first electrode and the fourth electrode are of opposite polarities, and the second electrode and the third electrode are of opposite polarities.

In Example 48, the subject matter of Example 35 and Example 42 can optionally include that the first battery cell, the second battery cell and the third battery cell are coupled in series.

Example 49 is an electronic device comprising: a circuit board to have at least one electronic component, a first battery cell having a first electrode, a second battery cell having a second electrode, and first means for coupling the first battery cell and the second battery cell and for changing a distance between the first battery cell and the second battery cell.

In Example 50, the subject matter of Example 49 can optionally include that the first means for coupling to expand and to increase a distance between the first battery cell and the second battery cell.

In Example 51, the subject matter of Example 49 can optionally include that the first means for coupling to compress and to decrease a distance between the first battery cell and the second battery cell.

In Example 52, the subject matter of Example 49 can optionally include that the second battery cell to couple to the circuit board.

In Example 53, the subject matter of Example 49 can optionally include a battery protection circuit.

In Example 54, the subject matter of Example 49 and Example 53 can optionally include second means for coupling to the second battery cell, and the second means for coupling being coupled to the battery protection circuit.

In Example 55, the subject matter of Example 49 and Example 54 can optionally include third means for coupling to the battery protection circuit and to the circuit board.

In Example 56, the subject matter of Example 49 and Example 53 can optionally include that the battery protection circuit is at the circuit board.

In Example 57, the subject matter of Example 49 can optionally include that the first means for coupling being coupled to the first electrode of the first battery cell, and the first means for coupling being coupled to the second electrode of the second battery cell.

In Example 58, the subject matter of Example 49 can optionally include that the first electrode of the first battery cell is at an end portion of the first battery cell.

In Example 59, the subject matter of Example 49 can optionally include that the first electrode of the first battery cell is at a side of the first battery cell.

In Example 60, the subject matter of Example 49 can optionally include: a third battery cell having a third electrode, and second means for coupling to the second battery cell and to the third battery cell and for changing a distance between the second battery cell and the third battery cell.

In Example 61, the subject matter of Example 49 and Example 60 can optionally include that the second means for coupling being coupled to the second electrode of the second battery cell, and the second means for coupling being coupled to the third electrode of the third battery cell.

In Example 62, the subject matter of Example 49 and Example 61 can optionally include: third means for coupling to the first battery cell and to the second battery cell, and fourth means for coupling to the second battery cell and to the third battery cell.

In Example 63, the subject matter of Example 49 and Example 62 can optionally include that the third means for coupling being coupled to a fourth electrode of the first battery cell and coupled to a fifth electrode of the second battery cell, and the fourth means for coupling being coupled to the fifth electrode of the second battery cell and coupled to a sixth electrode of the third battery cell.

In Example 64, the subject matter of Example 49 and Example 60 can optionally include that the first means for coupling being coupled to the first electrode of the first battery cell and to a fourth electrode of the second battery cell, and the second means for coupling being coupled to the second electrode of the second battery cell and the third electrode of the second battery cell.

In Example 65, the subject matter of Example 49 and Example 64 can optionally include that the first electrode and the fourth electrode are of opposite polarities, and the second electrode and the third electrode are of opposite polarities.

In Example 66, the subject matter of Example 49 and Example 60 can optionally include that the first battery cell, the second battery cell and the third battery cell are coupled in series.

In Example 67, the subject matter of Example 49 can optionally include that the electronic device is a smart watch.

In Example 68, the subject matter of Example 49 can optionally include a display to couple to the circuit board.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A battery pack comprising:
   a first battery cell having a first electrode;
   a second battery cell having a second electrode;
   a third battery cell having a third electrode;
   a first spring coupled to the first electrode of the first battery cell and to the second electrode of the second battery cell;
   a second spring coupled to the second battery cell and to the third battery cell, wherein the second spring is coupled to the second electrode of the second battery cell, and the second spring is coupled to the third electrode of the third battery cell;
   a third spring coupled to the first battery cell and the second battery cell; and
   a fourth spring coupled to the second battery cell and to the third battery cell, wherein the third spring is coupled to a fourth electrode of the first battery cell and is coupled to a fifth electrode of the second battery cell, and the fourth spring is coupled to the fifth electrode of the second battery cell and is coupled to a sixth electrode of the third battery cell.

2. The battery pack of claim 1, wherein the first spring to expand and to increase a distance between the first battery cell and the second battery cell.

3. The battery pack of claim 1, wherein the first spring to compress and to decrease a distance between the first battery cell and the second battery cell.

4. The battery pack of claim 1, wherein the first electrode of the first battery cell is at an end portion of the first battery cell.

5. The battery pack of claim 1, further comprising a battery protection circuit and a fifth spring, the fifth spring coupled to the battery protection circuit.

6. An electronic device comprising:
   a circuit board to have at least one electronic component;
   a first battery cell having a first electrode;
   a second battery cell having a second electrode;
   a third battery cell having a third electrode;
   a first spring coupled to the first electrode of the first battery cell and to the second electrode of the second battery cell;
   a second spring coupled to the second battery cell and to the third battery cell, wherein the second spring is coupled to the second electrode of the second battery cell, and the second spring is coupled to the third electrode of the third battery cell; and
   a third spring coupled to the first battery cell and the second battery cell, wherein the third spring is coupled to a fourth electrode of the first battery cell and is coupled to a fifth electrode of the second battery cell.

7. The electronic device of claim 6, wherein the first spring to expand and to increase a distance between the first battery cell and the second battery cell.

8. The electronic device of claim 6, wherein the first spring to compress and to decrease a distance between the first battery cell and the second battery cell.

9. The electronic device of claim 6, wherein the first battery cell to couple to the circuit board.

10. The electronic device of claim 6, further comprising a battery protection circuit.

11. The electronic device of claim 10, further comprising a fifth spring coupled to the third battery cell, and the fifth spring to couple to the battery protection circuit.

12. The electronic device of claim 11, further comprising a sixth spring coupled to the battery protection circuit and to couple to the circuit board.

13. The electronic device of claim 10, wherein the battery protection circuit is at the circuit board.

14. A battery pack comprising:
- a first battery cell having a first electrode and a third electrode;
- a second battery cell having a second electrode and a fourth electrode;
- first means for coupling to the first electrode of the first battery cell and to the second electrode of the second battery cell and for changing a distance between the first battery cell and the second battery cell; and
- second means for coupling to the third electrode of the first battery cell and to the fourth electrode of the second battery cell and for changing a distance between the first battery cell and the second battery cell.

15. The battery pack of claim 14, wherein the first means for coupling to expand and to increase a distance between the first battery cell and the second battery cell.

16. The battery pack of claim 14, wherein the first means for coupling to compress and to decrease a distance between the first battery cell and the second battery cell.

17. The electronic device of claim 6, further comprising a fourth spring coupled to the second battery cell and to the third battery cell, and the fourth spring is coupled to the fifth electrode of the second battery cell and is coupled to a sixth electrode of the third battery cell.

\* \* \* \* \*